United States Patent [19] [11] 4,383,180
Turner [45] May 10, 1983

[54] PARTICLE BEAM ACCELERATOR
[75] Inventor: Norman Turner, Gloucester, Mass.
[73] Assignee: Varian Associates, Inc., Palo Alto, Calif.
[21] Appl. No.: 264,498
[22] Filed: May 18, 1981
[51] Int. Cl.³ ............................................. H01J 37/317
[52] U.S. Cl. ................................ 250/492.2; 328/233; 250/398
[58] Field of Search ...................... 328/233; 313/359.1, 313/360.1; 250/423 R, 492.2, 492.3, 396 R, 396 ML, 397, 398; 219/121 EV

[56] References Cited
U.S. PATENT DOCUMENTS
3,710,163 1/1973 Bomko et al. ........................ 328/233

Primary Examiner—Alfred E. Smith
Assistant Examiner—Carolyn E. Fields
Attorney, Agent, or Firm—Stanley Z. Cole; William R. McClellan

[57] ABSTRACT

An ion beam implanter includes a high energy accelerator having N electrodes equally spaced along the path of an ion beam, where N is an integer greater than 2. A resistor voltage divider has N terminals respectively connected to the N electrodes. Resistances of the divider between adjacent ones of the electrodes have the same value. A variable DC voltage source applies a high positive voltage to terminal N of the divider, while the first terminal of the divider is grounded. Terminal N is connected to an electrode that is upstream of the electrode connected to the first terminal. A shorting bar is dimensioned and positioned to selectively engage terminals N, (N−1 ... 1. Drive means stepwise moves the shorting bar so an end portion of the bar sequentially engages terminals N, (N−1) ... 1 in order. The remainder of the bar engages terminals N, (N−1) ... (a+1) while the bar end portion engages terminal a, where a is selectively every integer from 1 to N. The stepwise movement of the shorting bar is synchronized with variations of the DC source to maintain a substantially constant voltage gradient along the length of the unshorted electrodes despite variations in energy applied to the beam by the accelerator. The drive means includes a pneumatically activated motor having rods with differences in length between fully extended and fully retracted positions thereof in binary relationship with the distance between adjacent ones of the N electrodes.

8 Claims, 5 Drawing Figures

PARTICLE BEAM ACCELERATOR

FIELD OF INVENTION

The present invention relates to particle beam accelerators and more particularly to a particle beam accelerator having several electrodes that are selectively short circuited together synchronously with changes in the magnitude of a DC voltage applied to the accelerator to maintain a substantially constant voltage gradient along the length of the unshorted electrodes despite variations in the energy applied to the beam by the accelerator. The invention has particular application to accelerating ion beams that are implanted into semiconductor wafers.

BACKGROUND ART

Machines for implanting semiconductor target wafers with ions have been extensively developed. Such machines typically include an ion source, an ion accelerator structure, an ion beam analyzer that selects an ion species from the source, and a lens for controlling the diameter of the beam. Downstream of the lens is a deflection system for the beam which is traveling in a straight line path along a longitudinal axis. In certain implanters, the deflection system includes a pair of X-Y electrostatic deflection plates, one downstream of the other in the ion beam propagation path. The downstream, usually X, deflection plates deflect the beam from the straight line path through a predetermined angle, typically from five to nine degrees, to remove neutral ions that are not of the desired species from the beam irradiating the target wafer.

The ion accelerating structure typically includes a first accelerator (frequently referred to as a pre-accelerator) between the ion source and the ion beam analyzer and a second accelerator (frequently referred to as a post-accelerator) between the analyzer and the quadrapole lens. The first and second accelerators supply sufficient energy to the ions to implant them to the desired depth in the wafer.

It is desired for certain applications for the amplitude of ion beam currents irradiating the semiconductor wafers to be relatively large, for example, three to four milliamperes. In the past, maximum ion beam currents have been up to typically one milliampere. It has been found, however, that if the same accelerator is used for ion beam currents having high and low levels and high and low energies the high current beam has a tendency to diverge as it propagates with lower energy through the accelerator. There is an appreciable decrease in the current of the ion beam irradiating the target because of this tendency of the beam to diverge. The problem can be solved by decreasing the effective length of the accelerator as the ion beam energy is decreased. It is most desirable for this purpose to maintain a constant voltage gradient in the accelerator for the ion beam, regardless of the beam current magnitude, to prevent spreading of the beam.

In the only prior art device that, to my knowledge considers this a problem, the post-accelerator includes eight ring electrodes that are at different potentials and are equi-spaced from each other along the ion beam path. A high voltage DC source is connected across the electrodes and a high voltage resistive divider has terminals connected to equal valued resistors and to adjacent ones of the electrodes, so there are equal voltage gradients between all of the electrodes. The electrodes connected to the highest voltage terminal of the voltage divider and to the third lowest voltage terminal of the divider are selectively connected together by a shorting bar. When the shorting bar is not connected to the third lowest voltage terminal of the voltage divider, the voltage between the highest and lowest voltage terminals of the divider is variable in steps from 175 kilovolts to 25 kilovolts; the voltage gradient between adjacent electrodes under these circumstances varies from 21.825 kilovolts per electrode to 6.25 kilovolts per electrode. When the shorting bar bridges the electrodes connected to the highest voltage terminal and third lowest terminal of the voltage divider together, the voltage between the highest and the lowest voltage terminals varies in steps from 50 kilovolts to 0 volts; the voltage gradient between adjacent electrodes under these circumstances varies from 16.667 kilovolts per electrode to 0 kilovolts per electrode. The voltage of the pre-accelerator is fixed at 25 kilovolts in this arrangement.

Thus, with this prior art arrangement there are very great differences in the voltage gradients under differing conditions and there is an appreciable step increase in the gradient when the shorting bar initially engages the third lowest voltage terminal of the voltage divider. While this post-accelerator structure was found to function satisfactory for prior art implanters with one milliamp maximum beam current, it is not satisfactory for implanters with maximum beam currents of three to four milliamps because a significant amount of the current from the analyzer diverges as it propagates through the post-accelerator and thereby never reaches the semiconductor wafer being irradiated.

It is, accordingly, an object of the present invention to provide a new and improved charged particle accelerator.

Another object of the invention is to provide a new and improved ion beam accelerator for ion beam implanters.

An additional object of the invention is to provide a new and improved charged particle beam accelerator having a variable effective length and a substantially constant voltage gradient along the length of the charged particle beam.

A further object of the invention is to provide an ion beam implanter with an improved ion beam accelerator capable of accelerating beams of variable amplitude and energies with substantially the same voltage gradient along the length of the beam.

THE INVENTION

In accordance with the present invention, an apparatus for accelerating charged particles from the source of the particles includes N longitudinally spaced accelerator electrodes for the particles, where a N is an integer greater than five. The K and (K+1) electrodes are longitudinally spaced from each other by a predetermined distance q. A resistor having a value R is connected between the K and (K+1) electrodes, where K=1, 2... (N−1). A shorting bar has a length, i.e., is dimensioned, and positioned so it selectively electrically engages every J one of the electrodes, where J is an integer at least equal to one N/J, where N/J is a positive integer. A drive means translates the shorting bar so an end portion of the shorting bar moves in a step-wise manner from the I to the (i−1) electrode, where i is every member in the set of J. The shorting bar is positioned so portions of it remote from the end portion engage the (m−1), (m−2) . . . electrodes when the end portion engages the M electrode, where m, (m−1), (m−2) . . . are in the set of J. Thereby, the m, (m−1), (m−2) . . . electrodes are short circuited together. A variable DC voltage source is connected between electrodes one and N. Variations of the voltage source are synchronized with movement of the bar between the J electrodes to maintain a substantially constant voltage gradient along the length of the unshorted electrodes despite variations in energy applied to the beam applied to the accelerator.

The invention is particularly suited for use in an ion beam implanter for implanting positive ions from an ion source into a semiconductor wafer. In such an application, the implanter includes a first means for accelerating ions from the source into a beam. The beam derived from the first accelerator means is bent to select a species of ions from the source. A second means accelerates the selected ion species into beams having variable high energy levels. Charged ions in the high energy beam are deflected away from neutral ions in the high energy beam so the charged ions in the high energy beam irradiate the wafer. The second means for accelerating thus includes N electrodes equally spaced along the path of the beam as it traverses the second means for accelerating, where N is an integer greater than two. Thus, the N electrodes in this situation are considered as the J electrodes in the previously mentioned situation. A resistive voltage divider having N terminals is provided. The N terminals are respectively connected to the N electrodes. The divider includes the same resistance between adjacent one of the electrodes. A variable DC source applies a high positive voltage to terminal N of the voltage divider, while ground is applied to the first terminal of the divider. Terminal N is connected to an electrode that is upstream, in the direction of ion beam propagation, of the electrode connect to the first terminal. A shorting bar is dimensioned and positioned to selectively engage terminals N, (N−1) . . . 1. A drive means provides stepwise movement for the shorting bar so an end portion of the bar sequentially engages terminals N (N−1) . . . 1 in order. The remainder of the bar engaging terminals N, (N−1) . . . (a+1) while the bar end portion engages terminal a, where a is selectively every integer from 1 to N. Stepwise movement of the shorting bar is synchronized with variations of the DC source to maintain a substantially constant voltage gradient along the length of the unshorted electrodes despite variations in energy applied to the beam by the second accelerator means.

Preferably, the shorting bar is driven by a series of d rods and the number of electrodes equals $2^d$. Each of the rods is driven only to fully extended and fully retracted positions by a pneumatic source. The difference in length between the fully extended and the fully retracted positions of a first rod is equal to the distance, D, between adjacent ones of the electrodes. The difference in length between the fully extended and retracted positions of a second rod is equal to twice the distance, 2D, between adjacent ones of the electrodes; the difference in length between the fully extended and retracted positions of a third rod is equal to four times the distance, 4D, between adjacent ones of the electrodes. In other words, a binary relationship exists between the differences in the fully extended and retracted positions of the rods, whereby rod b has a difference in length between the fully extended and retracted positions thereof of $2^{(b-1)}D$, where b is selectively every integer form 1 to d. In one preferred embodiment, N equals 4 and only two rods are required. The first and second rods have differences in lengths between the fully extended and retracted positions thereof equal to the distance between adjacent electrodes and twice the distance between adjacent electrodes. The rods are connected together and to the shorting bar to provide a smooth stepwise movement of the bar between any of the four electrodes.

The foregoing and additional objects and advantages will become apparent from the following detailed description of the drawing.

DETAILED DESCRIPTION OF THE PREFERRED EMBODIMENT

Figure 1:
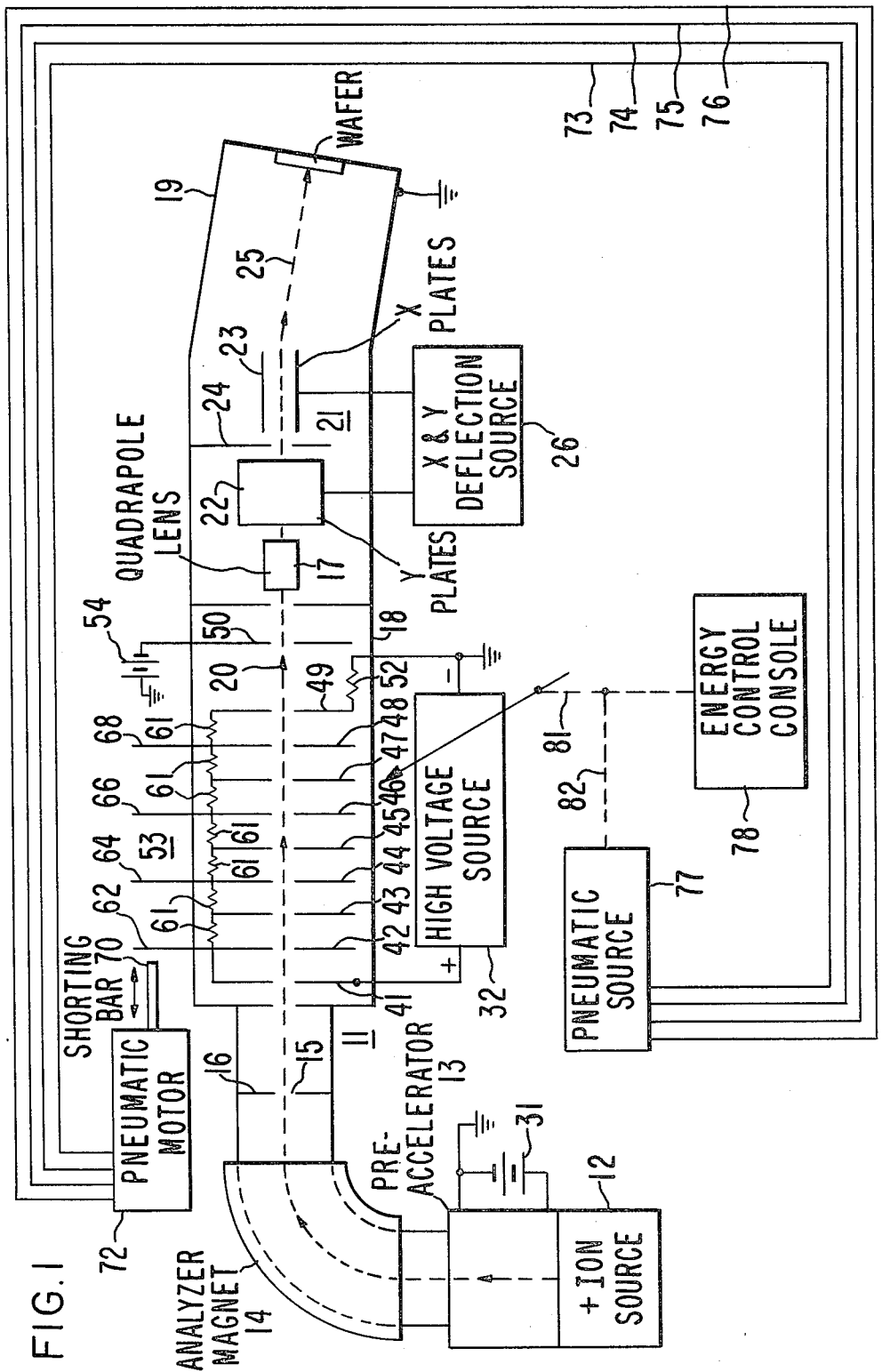
FIG. 1 is a schematic electric diagram of an ion implanter including the improved accelerator of the present invention.

Reference is now made to FIG. 1 of the drawing wherein ion implanter vacuum structure 11 is illustrated as including ion souce 12, from which is derived an ion beam by pre-accelerator 13. The beam emerging from pre-accelerator 13 is bent by magnetic ion specie selector 14, that is constructed in the usual manner as a mass analyzer. The magnetic field of selector 14 is varied to control the ion specie that is bent through the proper angle to traverse resolving aperture 15 in plate 16 and form a beam that is accelerated to quadrapole doublet lens 17 by post-accelerator 18. Selector 14 and lens 17 are energized by the usual voltage sources (not shown). The beam exiting lens 17 has a straight line path 20 and longitudinal axis coincident with the longitudinal axis of metallic, grounded vacuum envelope 19. The beam exiting lens 17 includes charged ions of the selected specie and neutral (uncharged) ions of another specie. Different ions in tube 19 have different energies, as a function of the total accelerating voltages of accelerators 13 and 18.

The beam exiting lens 17 traverses electrostatic deflection system 21 that deflects the beam along first and second axes at right angles to each other and the beam longitudinal axis. Deflection system 21 includes Y axis graphite deflection plates 22 and X axis graphite deflection plates 23, between which is positioned grounded graphite plate 24 having an aperture through which the beam propagates. Plates 23 are positioned downstream of plates 22 to facilitate bending of charged particles in the beam.

Plates 22 and 23 are responsive to deflecting voltages of source 26 which derives potentials for periodically scanning the beam. Source 26 also deflects the charged particles in the beam along the X axis into beam path 25, away from the neutral particles in the beam that continue in a path aligned with path 20.

The beam derived from source 12 is susceptible of widely varying currents, with a maximum amplitude of 3 to 4 milliamps. The beam derived from source 12 is also susceptible of being accelerated by pre- and postaccelerators 12 and 18 to widely variable energy levels, between 35 kev to 200 kev, depending upon the selected total particle energy desired.

To these ends, the upstream side of pre-accelerator 13 is biased with a constant positive voltage of 35 kilovolts relative to the downstream, grounded side thereof, with such biasing being provided by DC source 31. The upstream side of accelerator 18 is biased with a variable positive voltage having a maximum value of 165 kilovolts relative to the downstream, grounded side thereof, with such biasing being provided by variable DC source 32.

Accelerator 18 is formed as a cylinder including ten metalic ring electrodes 41-50; electrodes 41-50 are coaxial with each other and spaced from each other along the lane of the path of the ion beam propagating through the accelerator. The high voltage terminal of DC source 32 is connected directly to terminal 41 while the low voltage terminal of the DC source is connected to terminal 49 via resistor 52, a part of voltage divider 53. Electrodes 41 and 42 are short circuited to each other at all times, so both are biased to the voltage of the source 32. Electrode 50 is biased to a negative voltage of about 2 kilovolts by DC source 54, so the electrode repels secondary electrons to minimize accelerating secondary electrons from ground to terminal 41.

Electrodes 42-49 are equally spaced from each other along the length of the ion beam, as it propagates through accelerator 18. Adjacent ones of electrodes 42-49 are connected to each other by resistors 61 that are part of voltage divider 53. Each of resistors 52 and 61 has the same value so that equal voltage gradients are developed between adjacent terminals of voltage divider 53 and of adjacent ones of electrodes 42-49.

Electrodes 42, 44, 46 and 48 respectively include metal fingers 62, 64, 66 and 68 that extend radially from a cylindrical wall of accelerator 18. Each of fingers 62, 64, 66 and 68 includes a circular aperture (not shown) through which metal shorting bar 70 is translated. A surface in each of fingers 62, 64, 66 and 68 on the periphery of each aperture includes a contact region for bar 70 so that bar 70 is selectively, electrically connected to only electrode 42, or to electrodes 42 and 44, or to electrodes 42, 44 and 46, or to electrodes 42, 44, 46 and 48.

Shorting bar 70 is selectively translated in a smooth stepwise manner in the forward and reverse direction between fingers 62, 64, 66 and 68 by pneumatic motor 72, in turn connected by fluid conduits 73-76 to pneumatic source 77. Conduits 73-76 supply fluid pressure to opposite sides of two pistons within two cylinders of motor 70. One piston responds to fluids in line 73 and 74 to drive a first rod from a fully retracted to a fully extended position through a distance equal to the distance between fingers 62 and 64, while the other piston responds to the fluid in lines 75 and 77 to drive a second rod from a fully retracted to a fully extended position through a distance equal to the distance between fingers 62 and 66. The two rods are interconnected to each other and to shorting bar 70 to provide the desired stepwise translation of the end portion of the bar from finger 62 to finger 64, to finger 66, and to finger 68.

Pneumatic source 77 supplies fluids to conduits 73-76 synchronously with variations of high voltage source 32 in response to settings established by an operator of energy control console 78. To this end, console 78 includes an energy dial (not shown). The energy dial includes shafts that are mechanically interconnected to drive shafts 81 and 82, respectively connected between console 78 and each of sources 32 and 77. Source 77 drives pneumatic motor 72 and therefore bar 70 in synchronism with voltage variations of source 32 to achieve a substantially constant voltage gradient in accelerator 18 as the effective length of the accelerator is varied by the shorting bar. In one particular embodiment, the end of shorting bar 70 is related to voltage variations of source 32 as follows:

TABLE

| END OF SHORTING BAR 70 ENGAGES FINGER | VOLTAGE RANGE OF SOURCE 32 (kv) | RANGE OF VOLTAGE GRADIENTS ACROSS EACH RESISTOR OF DIVIDER 53 (kv) |
|---|---|---|
| 62 | 165-125 | 20.625-15.625 |
| 64 | 125-75 | 20.833-12.500 |
| 66 | 75-35 | 18.750-8.750 |
| 68 | 35-0 | 17.500-0.000 |

From the Table, it is seen that the voltage gradient across the resistors of divider 53 remains relatively constant with relatively wide variations in the energy applied by accelerator 18 to the positive ion beam. This is particularly important with ion beams having relatively wide current amplitude variations and wide energy values, such as ion beams having maximum current amplitudes in the 3-4 milliampere range and energy variations between 35 kev to 200 kev.

Figure 2:
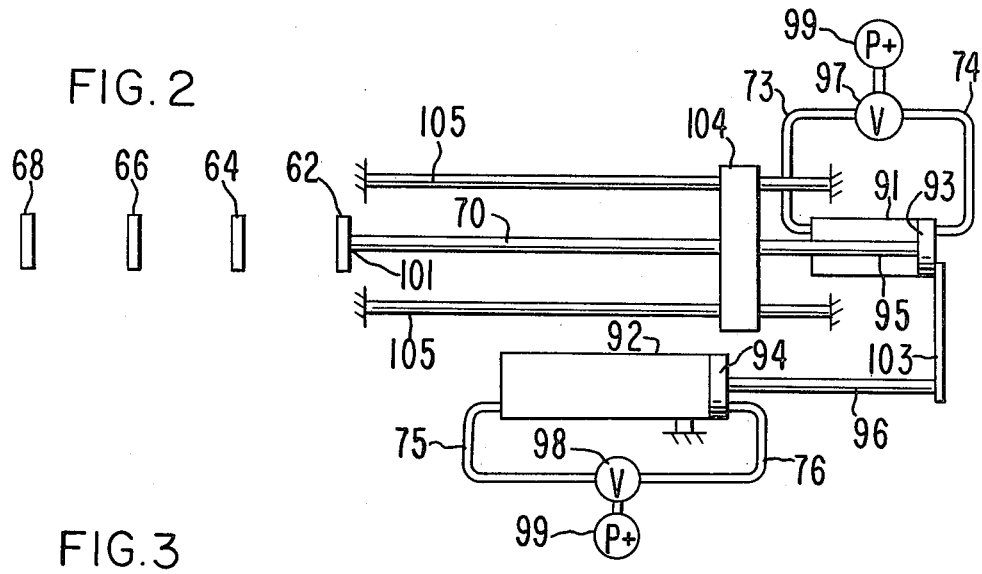
FIG. 2 is a schematic mechanical diagram of a drive mechanism utilized in the accelerator of FIG. 1, wherein the drive mechanism is activated to drive a shorting bar so it engages only one electrode.

Reference is now made to FIG. 2 of the drawing wherein pneumatic motor 72 is schematically illustrated as including pneumatic responsive cylinders 91 and 92 in which are respectively included pistons 93 and 94 that carry rods 95 and 96. Opposite ends of cylinder 91 are connected to conduits 73 and 74, while opposite ends of cylinder 92 are connected to conduits 75 and 76. Conduits 73 and 74 are connected to opposed outlet ports of valve 97, while conduits 75 and 76 are connected to opposed outlet ports of valve 98; valves 97 both have an inlet port connected to positive pressure fluid (preferably air) source 99.

Figure 3:
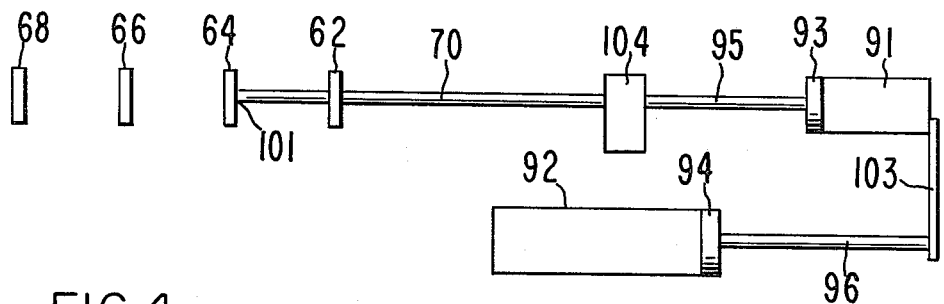
FIGS. 3, 4 and 5 are schematic mechanical diagrams of part of the structure illustrated in FIG. 2 wherein the shorting bar respectively engages two, three and four electrodes.
Figure 4:
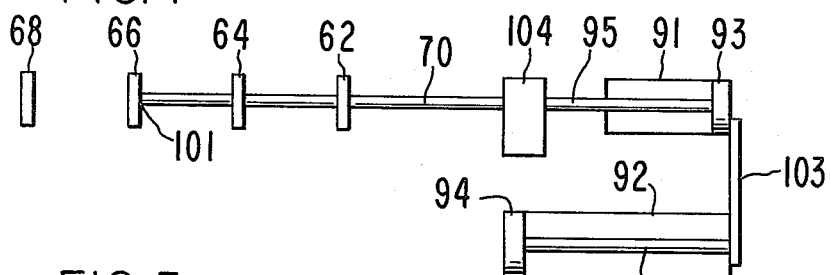
Figure 5:
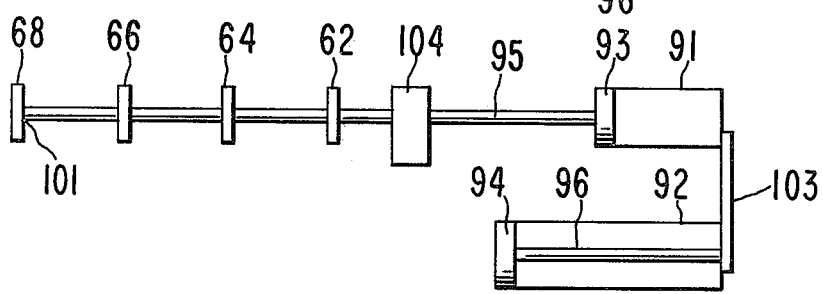

Valves 97 and 98, as well as source 99, are part of pneumatic source 77. Valves 97 and 98 are driven by shaft 82 to 4 combinations of positions. In a first position, valves 97 and 98 are activated so fluid flows through conduits 73 and 75 to the exclusion of conduits 74 and 76, whereby pistons 93 and 94 are both driven to the right sides of cylinders 91 and 92, as shown in FIG. 2. In a second position, valves 97 and 98 are activated so fluid flows conduits 74 and 75 to the exclusion of conduits 73 and 76, whereby pistons 93 and 94 are driven to the left side of cylinder 91 and to the right side of cylinder 92, as illustrated in FIG. 3. In a third position, valves 97 and 98 are activated so fluid flows through conduits 73 and 76 to the exclusion of conduits 74 and 75, whereby pistons 93 and 94 are driven to the right side of cylinder 91 and to the left side of cylinder 92, as illustrated in FIG. 4. In the fourth position, valves 97 and 98 are activated so fluid flows through conduits 74 and 76 to the exclusion of conduits 73 and 75, whereby pistons 93 and 94 are both to the left side of cylinders 91 and 92 as illustrated in FIG. 5. Thereby, in the first position (FIG. 2), rods 95 and 96 are fully retracted and fully extended; in the second position (FIG. 3), rods 95 and 96 are both fully extended; in the third position (FIG. 4), rods 95 and 96 are both fully retracted; and in the fourth position (FIG. 5), rod 95 is fully extended while rod 96 is fully extracted.

Rods 95 and 96 are connected to each other and to shorting bar 70 and the difference in the length between the fully extended and fully extracted positions of the rods are such that end portion 101 of bar 70 is stepwise translated in a smooth manner from finger 62 to finger 64, to finger 66, to finger 68, as illustrated in each of FIGS. 2–5. The holes in fingers 62, 64, 66 and 68 that the shorting rod 70 passes through, contain spring and ball contacts which provide good electrical connection between the fingers and rod 70. To these ends, the difference in length between the fully extended and fully retracted positions of rod 95 is equal to the distance between a pair of adjacent fingers, such as fingers 62 and 64, while the difference in length between the fully extended and fully retracted position of rod 96 is equal to twice the distance between a pair of adjacent fingers, i.e., the difference in length between fingers 62 and 66. Cylinder 92 is fixedly connected to structure in envelope 19, while the end of cylinder 91 connected to conduit 74 is connected to a face of plate 103 that is connected to the end of rod 96 remote from piston 94. Thereby, cylinder 91 is translated through a distance equal to the difference in length between the fully extended and fully retracted positions of rod 96, as illustrated in FIGS. 3 and 4, respectively. The end of rod 95 remote from piston 93 is connected in driving relation to trolley 104 that is carried by fixed guide rails 105, having mutually parallel axes that are also parallel with the axis of shorting bar 70. Shorting bar 70 is carried by trolley 104 and extends from a side of the trolley opposite to the side of the trolley which is connected to rod 95. Thereby, shorting bar 70 is driven to the four different positions illustrated in FIGS. 2-5 in response to the four previously named conditions of valves 97 and 98.

While a preferred embodiment of the invention has been specifically described and illustrated it is to be understood that variations in the described embodiment can be made within the scope of the claims.

I claim:

1. Apparatus for accelerating charged particles from a source of said particles into a beam of said particles comprising N longitudinally spaced accelerator electrodes for the particles, where N is an integer, the kth and (k+1)th electrodes being longitudinally spaced from each other by a predetermined distance q, where $k=1,2\ldots(N-1)$, a shorting bar dimensioned and positioned so it selectively electrically engages every jth one of said electrodes, where j is an integer at least equal to one and N/j is a positive integer greater than two, drive means for translating the shorting bar so an end portion thereof moves in a stepwise manner from the ith electrode to the (i−1) electrode, where i is every member in the set of j, the shorting bar being positioned so portions of it remote from the end portion engage the (m−1)th, (m−2)th ... electrodes when the end portion engages the mth electrode, where m, (m−1), (m−2) ... are in the set of j, a variable DC source connected between electrodes one and N, and means for synchronizing variations of the voltage source and movements of the bar end portion between the jth electrodes to maintain a substantially constant voltage gradient along the length of the unshorted electrodes despite variations in energy applied to the beam by the accelerator.

2. The apparatus of claim 1 wherein the shorting bar selectively electrically engages a maximum of four of said j electrodes, said drive means including first and second rods, means for driving the first and second rods only to fully extended and fully retracted positions, the difference in length between the fully extended and fully retracted positions of one of the rods being equal to the distance between adjacent ones of said electrodes, the difference in length between the fully extended and fully retracted positions of the other of the rods being equal to twice the distance between adjacent ones of said j electrodes, and means for coupling said first and second rods together and to the shorting bar so the shorting bar moves in stepwise relationship between adjacent ones of said four electrodes.

3. The apparatus of claim 1 wherein the shorting bar selectively electrically engages a maximum of $2^d$ of said j electrodes, said drive means including d rods, means for driving the d rods only to fully extended and fully retracted positions, the difference in length between the fully extended and fully retracted positions of a first rod being equal to the distance, q, between adjacent ones of said electrodes, the difference in length between the fully extended and fully retracted position of a second rod being equal to 2q, the difference in length between the fully extended and fully retracted positions of the b rod being equal to $2^{(b-1)}q$, where b is selectively every integer from 1 to d.

4. The apparatus of claims 2 or 3 further including pneumatic motor means for driving the rods to the fully extended and fully retracted positions.

5. An ion beam implanter for implanting positive ions from an ion source into a semiconductor wafer comprising first means for accelerating ions from the source into a beam, means for bending the beam derived from the first accelerator means to select a species of ions from the source, second means for accelerating the selected species of ions from the source into a high energy beam, means for deflecting charged ions in the high energy beam away from neutral ions in the high energy beam so the charged ions in the high energy beam irradiate the wafer, said second means for accelerating including:

N electrodes equally spaced along the path of the beam as it traverses the second means for accelerating, where N is an integer greater than 2, a resistive voltage divider having N terminals respectively connected to the N electrodes, said divider having the same resistance between adjacent ones of said electrodes, a variable DC source for applying a high positive voltage to terminal N of the divider, ground being applied to the first terminal of the divider, terminal N being connected to an electrode that is upstream, in the direction of ion beam propagation, of the electrode connected to the first terminal, a shorting bar dimensioned and positioned to selectively engage terminals N, (N−1) ... 1, drive means for stepwise moving the shorting bar so an end portion of the bar sequentially engages terminals N, (N−1) ... 1 in order, the remainder of the bar engaging terminals N, (N−1) ... (a+1) while the bar end portion engages terminal a, where a is selectively every integer from 1 to N, and means for synchronizing the stepwise movement with variations of the DC source to maintain a substantially constant voltage gradient along the length of the unshorted electrodes despite variations in energy applied to the beam by the second accelerator means.

6. The ion beam implanter of claim 5 wherein N=4, said drive means including first and second rods, means for driving the first and second rods only to fully extended and fully retracted positions, the difference in length between the fully extended and fully retracted positions of one of the rods being equal to the distance between adjacent ones of said N electrodes, the difference in length between the fully extended and fully retracted positions of the other of the rods being equal to twice the distance between adjacent ones of said N electrodes, and means for coupling said first and second rods to each other and to the shorting bar so the shorting bar moves in stepwise relationship between adjacent ones of N electrodes.

7. The ion beam implanter of claim 5 wherein $N=2^d$, said drive means including d rods, means for driving the d rods only to fully extended and fully retracted positions, the difference in length between the fully extended and fully retracted positions of rod b being equal to the distance between $2^{(b-1)}$ to D, where D equals the distance between the adjacent ones of the N electrodes and b is selectively every one of 1 through d, whereby the difference in length between the fully extended and fully retracted positions of rod 1 is equal to D, and means for coupling said rods together and to the shorting bar so the shorting bar moves in stepwise relationship between adjacent ones of said N electrodes.

8. The ion implanter of claim 6 or 7 further including pneumatic motor means for stepwise moving the bars between the fully extended and fully retracted positions.

* * * * *